(12) United States Patent
Neubauer

(10) Patent No.: US 6,944,220 B2
(45) Date of Patent: Sep. 13, 2005

(54) CIRCUIT CONFIGURATION FOR THE OFFSET COMPENSATION OF A SIGNAL

(75) Inventor: Andre Neubauer, Krefeld (DE)

(73) Assignee: Infineon Technologies AG, Munich (DE)

(*) Notice: Subject to any disclaimer, the term of this patent is extended or adjusted under 35 U.S.C. 154(b) by 409 days.

(21) Appl. No.: 10/174,283

(22) Filed: Jun. 17, 2002

(65) Prior Publication Data
US 2002/0191720 A1 Dec. 19, 2002

Related U.S. Application Data

(63) Continuation of application No. PCT/DE00/04493, filed on Dec. 13, 2000.

(30) Foreign Application Priority Data
Dec. 17, 1999 (DE) .......................... 199 61 121

(51) Int. Cl.⁷ .............................. H04B 1/10; H03H 7/30
(52) U.S. Cl. .................. 375/232; 375/350; 375/240.02; 708/300; 708/322
(58) Field of Search .................. 375/148, 240.02, 375/232, 233, 346, 326, 350, 341; 708/300, 320, 322; 382/263; 379/406.1

(56) References Cited

U.S. PATENT DOCUMENTS

| 4,868,775 A | * | 9/1989 | Kobayashi et al. ......... 708/322 |
| 4,868,874 A | * | 9/1989 | Takatori et al. .......... 379/406.1 |
| 5,557,646 A | * | 9/1996 | Honma ...................... 375/346 |

FOREIGN PATENT DOCUMENTS

| DE | 31 41 500 A1 | 7/1982 |
| EP | 0 353 891 A2 | 2/1990 |
| EP | 0 959 568 A1 | 11/1999 |
| WO | WO 97/27695 | 7/1997 |

* cited by examiner

Primary Examiner—Shuwang Liu
Assistant Examiner—Ted M Wang
(74) Attorney, Agent, or Firm—Laurence A. Greenberg; Werner H. Stemer; Ralph E. Locher

(57) ABSTRACT

For the offset compensation of a digital signal, particularly of a communication signal transmitted in a cordless digital communication system, a recursive digital filter is used. The recursive digital filter has at least one filter coefficient that is varied in a time-dependent manner. The recursive digitial filter has a first multiplying device multiplying symbols of the digital input signal by a first time-variable filter coefficient to obtain a digital output signal having symbols.

10 Claims, 1 Drawing Sheet

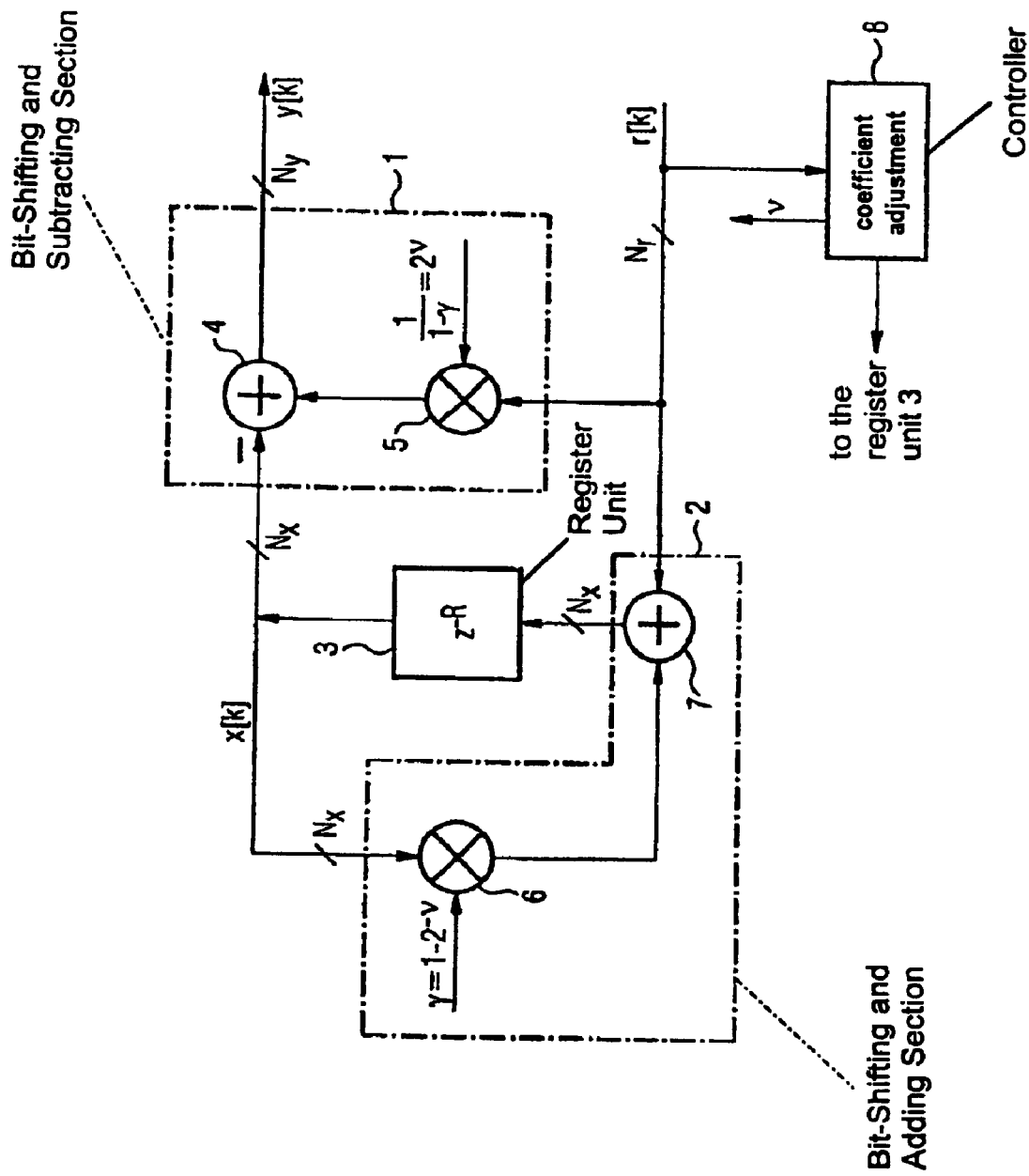

CIRCUIT CONFIGURATION FOR THE OFFSET COMPENSATION OF A SIGNAL

CROSS-REFERENCE TO RELATED APPLICATION

This application is a continuation of copending International Application No. PCT/DE00/04493, filed Dec. 13, 2000, which designated the United States and was not published in English.

BACKGROUND OF THE INVENTION

Field of the Invention

The present invention relates to a circuit configuration for the offset compensation of a signal, particularly of a frequency-modulated received signal in a cordless digital communication system. The invention also relates to a method for offset compensation by using such a circuit arrangement in order to be able to compensate for low-frequency or direct-current offset components contained in the respective signal.

In many cordless digital communication systems such as, for example, communication systems according to the DECT (digital enhanced cordless telecommunications), WDCT (world-wide digital cordless communications), Bluetooth, or the SWAP (shared wireless access protocol) mobile radio standard, FM (frequency modulation) demodulators are used for receiving frequency-modulated radio-frequency signals. In these systems, a GFSK (Gaussian Frequency Shift Keying) modulation is frequently used as a type of digital frequency modulation. As a rule, the output signal of such FM demodulators is disturbed by an offset that changes slowly in a time-dependent manner and is caused by equipment tolerances, frequency offsets or drift between the transmitter and the receiver. This offset is not known in advance.

For this reason, the use of circuit arrangements for compensating for such offsets is required in the receivers so that the symbols of the offset-compensated received signals can then be decided or assessed in an undisturbed and correct manner as a result of which the performance of the receiver can be optimized and the bit error rate can be reduced for a predetermined signal/noise ratio.

In conventional analog receivers, analog circuits are exclusively used for compensating for a low-frequency or direct-current offset. These known analog circuits consist of an analog low-pass filter for approximately estimating the offset signal and then subtracting the low-pass-filtered signal from the input signal in dependence on this estimate which, overall, corresponds to high-pass filtering.

However, this exclusively analog principle is not suitable if relatively short time intervals such as, for example, the preamble of a digital bluetooth communication signal with a duration of only 4 µs have to be compensated for or filtered, respectively.

In International Publication WO 97/27695 A, a receiver with a recursive digital filter is described. The filter is used for eliminating phase and frequency offsets from a received signal. The filter has time-variable filter coefficients for this purpose.

SUMMARY OF THE INVENTION

It is accordingly an object of the invention to provide a circuit configuration for the offset compensation of a signal, particularly of a communication signal, which overcomes the above-mentioned disadvantages of the prior art circuits and methods of this general type.

In particular, it is an object of the invention to provide a circuit configuration for the offset compensation of a signal in which the effectiveness of the offset compensation is improved.

According to the invention, it is assumed that the signal to be compensated for is present in digital form. For the offset compensation, it is not an analog filter but a recursive digital filter which is used, one or more filter coefficients of which can be adjusted in a time-dependent manner.

In this manner, different compensation phases can be implemented. In particular, it is thus possible to subject the preamble of a timeslot or of a burst of a digital communication signal to a relatively fast offset compensation and rather to subject the actual user information of the same timeslot or burst to a slow offset compensation. Due to the time-variant filtering forming the basis of the invention and due to the multi-phase principle of the recursive digital filter described above, the compensation effectiveness is distinctly improved. In particular, short time intervals such as, for example, the short preamble of a bluetooth communication signal can be effectively compensated for.

For the recursive digital filter, a special embodiment is proposed which, in particular, manages without real multipliers and can thus be implemented with advantageous costs and expenditure. The transfer function H(z) of the recursive digital filter can advantageously correspond to the expression $$\frac{1}{1-\gamma} \cdot \frac{1-z^{-R}}{1-\gamma \cdot z^{-R}}.$$

With the foregoing and other objects in view there is provided, in accordance with the invention, a circuit configuration for the offset compensation of a digital input signal having symbols. The circuit configuration includes: a recursive digital filter being supplied with the digital input signal to be compensated. The recursive digital filter has at least a first time-variable filter coefficient and a second time-variable filter coefficient. The recursive digital filter includes a register device outputting symbols of a digital intermediate signal. The recursive digital filter includes a first multiplying device and a subtracting device. The first multiplying device multiplies the symbols of the digital input signal by the first time-variable filter coefficient to obtain a digital output signal having symbols. The subtracting device subtracts the symbols of the digital intermediate signal from the symbols of the digital output signal of the first multiplying device to obtain symbols of an offset-compensated digital output signal. The recursive digital filter includes a second multiplying device and an adding device. The second multiplying device multiplies the symbols of the digital intermediate signal by the second time-variable filter coefficient to obtain a digital output signal having symbols. The adding device adds the symbols of the digital output signal of the second multiplying device to the symbols of the digital input signal. The register device receives the symbols of the digital output signal of the adding device.

In accordance with an added feature of the invention, the first filter coefficient is two raised to a power by an exponent; the second filter coefficient is two raised to a power by an exponent; the first multiplying device is implemented as a bit-shifting device that shifts the digital input signal by a number of bit positions corresponding to the exponent of the first filter coefficient; and the second multiplying device is implemented as a bit-shifting device that shifts the digital intermediate signal by a number of bit positions corresponding to the exponent of the second filter coefficient.

In accordance with an additional feature of the invention, the register device is constructed in accordance with a transfer function $z^{-R}$; and R is an oversampling ratio of the symbols of the digital input signal.

In accordance with another feature of the invention, the first filter coefficient is $2^v$ and the second filter coefficient is $1-2^{-v}$; and v designates a time-variable integral parameter.

In accordance with a further feature of the invention, the recursive digital filter is constructed to have a transfer function $$\frac{1}{1-\gamma} \cdot \frac{1-z^{-R}}{1-\gamma \cdot z^{-R}};$$

R is an oversampling ratio of the symbols of the digital input signal; and $\gamma$ is the second filter coefficient.

In accordance with a further added feature of the invention, the second filter coefficient is $1-2^{-v}$.

In accordance with a further additional feature of the invention, a control device is provided for setting the first filter coefficient and the second filter coefficient in time-dependence on the digital input signal.

In accordance with yet an added feature of the invention, the first filter coefficient is $2^v$ and the second filter coefficient is $1-2^{-v}$; v is a time-variable integral parameter; the register device has registers; and the digital input signal is subdivided into predefined time intervals. The control device sets the time-variable integral parameter v to a first value at a beginning of each one of the time intervals and initializes the registers of the register device with zero to, in dependence thereon, carry out offset compensation during a first phase of a corresponding one of the time intervals. After the first phase has been completed, the control device sets the time-variable integral parameter v to a second value that is higher than the first value, the control device forms a mean $r_0$ over a particular number of the symbols of the digital input signal, and the control device initializes the registers of the register device with a value equal to $2^v \cdot r_0$ in order to perform, in dependence on the second value, the mean $r_0$, and the value equal to $2^v \cdot r_0$, offset compensation during a second phase of the corresponding one of the time intervals.

In accordance with yet an additional feature of the invention, the digital input signal is a communication signal; and the first phase and the second phase is of a length of time such that preamble information contained in a respective one of the time intervals is offset-compensated by the first phase and user information of the communication signal contained in the respective one of the time intervals is offset-compensated by the second phase.

In accordance with yet another feature of the invention, the recursive digital filter is used in a digital receiver of a bluetooth communication system.

Other features which are considered as characteristic for the invention are set forth in the appended claims.

Although the invention is illustrated and described herein as embodied in a circuit arrangement and method for the offset compensation of a signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The drawing figure shows a recursive digital filter.

DESCRIPTION OF THE PREFERRED EMBODIMENTS

Referring now to the drawing figure in detail, there is shown a recursive digital filter (an IIR—Infinite Impulse Response filter) with time-variable filter characteristics. The filter is used for compensating for or eliminating the low-frequency offset components of a digital input signal $r[k]=r(k \cdot T_s)$ that is supplied to the recursive digital filter. In the present case, the digital input signal is the analog PAM (Pulse Amplitude Modulation) output signal of an FM demodulator used in a receiver of a corresponding digital communication system. The digital input signal has been digitized, that is to say sampled and then quantized.

The digital input signal $r[k]$ can be present in oversampled form so that the following holds true:

$$R = \frac{T_{bit}}{T_S}$$

where R is the oversampling factor, $T_S$ is the symbol duration of the input signal $r[k]$ and $T_{bit}$ is the duration of the bit received from the receiver.

Performing offset compensation of the digital input signal of the word length $N_r$, using the recursive digital filter, provides a high-pass-filtered output signal $y[k]$ having the word length $N_y$.

The recursive digital filter essentially includes a bit-shifting and bit-subtracting section 1, a bit-shifting and bit-adding section 2 and a register unit 3.

The bit-shifting and bit-subtracting section 1 includes a multiplier 5 and an adder 4 which is supplied with a digital intermediate signal $x[k]$ (word length $N_x$) with a negated sign. The multiplier 5 multiplies the symbols of the digital input signal $r[k]$ by the factor $2^v$. The integral parameter v is changed and set in a time-dependent manner, in particular, by a controller 8. Using the adder 4, the intermediate signal $x[k]$ is subtracted from the output signal of the multiplier 5 in order to thus obtain the digital offset-compensated output signal $y[k]$.

The bit-shifting and bit-adding section 2 includes a multiplier 6 and an adder 7. The multiplier 6 multiplies the symbols of the digital intermediate signal $x[k]$ by the factor $1-2^{-v}$. Using the adder 7, the output signal of the multiplier 6 is added to the input signal $r[k]$ and the result of the addition is supplied to the register unit 3.

The register unit 3 which includes R registers has the transfer function $z^{-R}$ and outputs the output signal of the adder 7 delayed in time by R symbols as the intermediate signal $x[k]$. As will be explained in still greater detail in the text which follows, the individual registers of the register unit 3 can also be initialized by the controller 8.

The digital IIR filter shown can be described by the following state equations:

$$x[k+R]=\gamma \cdot x[k]+r[k]$$

$$y[k] = \frac{1}{1-\gamma} \cdot r[k] - x[k]$$

The corresponding transfer function H(z) of the digital IIR filter is:

$$\frac{1}{1-\gamma} \cdot \frac{1-z^{-R}}{1-\gamma \cdot z^{-R}}$$

As shown in the figure, the filter coefficient is defined by $\gamma = 1-2^{-v}$.

The filter coefficient was selected as described above in order to make it possible to implement the digital IIR filter without real multipliers. Since the filter coefficients or multiplication factors $2^v$ or $1-2^{-v}$, respectively, used by the filter, can be represented by powers of two in each case, the function of the multipliers 5, 6 can be implemented by simple bit-shifting operations corresponding to the exponent of the respective filter coefficient.

In the text which follows, the operation of the digital filter shown will be explained by using a received communication signal r[k] subdivided into predefined time intervals, i.e. into bursts or timeslots, and the offset compensation proceeds in a number of successive phases.

First, the filter coefficient parameter v is set to a relatively small value by the controller 8 at the beginning of a received burst and the internal $R \times N_x$- register unit 3 is initialized with the value zero. Following that, the offset compensation of the digital received signal r[k] is carried out on the basis of these settings. Due to the relatively small value for the parameter V, the compensation is "fast" so that this phase is suitable, in particular, for offset compensation of the preamble of the received signal r[k] which, as a rule, includes signaling, synchronizing and access information.

Following that, a "slow" offset compensation is carried out for the actual user data of the burst. For this purpose, the parameter v and the register unit 3 are reinitialized. For the initialization, the digital received signal r[k] is first accumulated over a particular time interval. The length of this time interval is selected in such a manner that an approximate estimation of the offset contained in the received signal r[k] is possible. The time interval corresponds to the length $L \cdot T_{bit}$ i.e. $L \cdot R$ samples or symbols of the received signal r[k]. The result of the accumulation is then divided by the number $L \cdot R$ of the symbols in order to determine an arithmetic mean $r_0$. As the length of the time interval, $L \cdot R=52$ can be used, for example. In dependence on the mean $r_0$ thus calculated, the R individual registers with the word length $N_x$ of the register unit 3 are initialized with the value $2^v \cdot r_0$ for the "slow" offset compensation and the parameter v is set to a higher value than at the beginning of the burst. Following this, the "slow" offset compensation or filtering of the digital received signal r[k] is effected on the basis of these new settings up to the end of the corresponding burst.

Thus, two different initialization phases are carried out during a burst. No advance information is used for the first initialization of the recursive digital filter whereas signal patterns received at the end of the preamble area are used for the second initialization. These can be, for example, signal patterns transmitted at the end of a synchronization word etc. Two different filter or offset compensation phases are carried out on the basis of these different initializations: the "fast" first filtering covers, in particular, the access information transmitted in the preamble whereas the "slow" second filtering is carried out for the actual user information of the respective burst.

I claim:

1. A circuit configuration for offset compensation of a digital input signal having symbols, the circuit configuration comprising:
   a recursive digital filter being supplied with the digital input signal to be compensated, said recursive digital filter having at least a first time-variable filter coefficient and a second time-variable filter coefficient;
   said recursive digital filter including a register device outputting symbols of a digital intermediate signal;
   said recursive digital filter including a first multiplying device and a subtracting device, said first multiplying device multiplying the symbols of the digital input signal by the first time-variable filter coefficient to obtain a digital output signal having symbols, said subtracting device subtracting the symbols of the digital intermediate signal from the symbols of the digital output signal of said first multiplying device to obtain symbols of an offset-compensated digital output signal;
   said recursive digital filter including a second multiplying device and an adding device, said second multiplying device multiplying the symbols of the digital intermediate signal by the second time-variable filter coefficient to obtain a digital output signal having symbols, said adding device adding the symbols of the digital output signal of said second multiplying device to the symbols of the digital input signal to generate a digital output having symbols; and
   said register device receiving the symbols of the digital output signal of said adding device.

2. The circuit configuration according to claim 1, wherein:
   the first time variable filter coefficient is two raised to a power by an exponent;
   the second time variable filter coefficient is two raised to a power by an exponent;
   said first multiplying device is implemented as a bit-shifting device that shifts the digital input signal by a number of bit positions corresponding to the exponent of the first time variable filter coefficient; and
   said second multiplying device is implemented as a bit-shifting device that shifts the digital intermediate signal by a number of bit positions corresponding to the exponent of the second time variable filter coefficient.

3. The circuit configuration according to claim 1, wherein:
   said register device is constructed in accordance with a transfer function $z^{-R}$; and
   R designates an oversampling ratio of the symbols of the digital input signal.

4. The circuit configuration according to claim 1, wherein:
   the first time variable filter coefficient is $2^v$ and the second time variable filter coefficient is $1-2^{-v}$; and
   v designates a time-variable integral parameter.

5. The circuit configuration according to claim 1, wherein:
   said recursive digital filter is constructed to have a transfer function $$\frac{1}{1-\gamma} \cdot \frac{1-z^{-R}}{1-\gamma \cdot z^{-R}};$$

R is an oversampling ratio of the symbols of the digital input signal; and
   $\gamma$ is the second time variable filter coefficient.

6. The circuit configuration according to claim 5, wherein the second time variable filter coefficient is $1-2^{-v}$.

7. The circuit configuration according to claim 1, comprising:
 a control device for setting the first time variable filter coefficient and the second time variable filter coefficient in time-dependence on the digital input signal.

8. The circuit configuration according to claim 7, wherein:
 the time variable first filter coefficient is $2^v$ and the second time variable filter coefficient is $1-2^{-v}$;
 v is a time-variable integral parameter;
 said register device has registers;
 the digital input signal is subdivided into predefined time intervals;
 said control device sets the time-variable integral parameter v to a first value at a beginning of each one of the time intervals and initializes said registers of said register device with zero to, in dependence thereon, carry out offset compensation during a first phase of a corresponding one of the time intervals; and
 after the first phase has been completed, said control device sets the time-variable integral parameter v to a second value that is higher than the first value, said control device forms a mean $r_0$ over a particular number of the symbols of the digital input signal, and said control device initializes said registers of said register device with a value equal to $2^v \cdot r_0$ in order to perform, in dependence on the second value, the mean $r_0$, and the value equal to $2^v \cdot r_0$, offset compensation during a second phase of the corresponding one of the time intervals.

9. The circuit configuration according to claim 8, wherein:
 the digital input signal is a communication signal; and
 the first phase and the second phase are of a length of time such that preamble information contained in a respective one of the time intervals is offset-compensated by the first phase and user information of the communication signal contained in the respective one of the time intervals is offset-compensated by the second phase.

10. A method of configuring a digital receiver of a bluetooth communication system, the method which comprises:
 providing the digital receiver; and
 using the a circuit configuration in the digital receiver, the circuit configuration providing offset compensation of a digital input signal having symbols, the circuit configuration containing:
 a recursive digital filter being supplied with the digital input signal to be compensated, the recursive digital filter having at least a first time-variable filter coefficient and a second time-variable filter coefficient;
 the recursive digital filter including a register device outputting symbols of a digital intermediate signal;
 the recursive digital filter including a first multiplying device and a subtracting device, the first multiplying device multiplying the symbols of the digital input signal by the first time-variable filter coefficient to obtain a digital output signal having symbols, the subtracting device subtracting the symbols of the digital intermediate signal from the symbols of the digital output signal of the first multiplying device to obtain symbols of an offset-compensated digital output signal;
 the recursvie digital filter including a second multiplying device and an adding device, the second multiplying device multiplying the symbols of the digital intremediate signal by the second time-variable filter coefficient to obtain a digital output signal having symbols, the adding device adding the symbols of the digital output signal of the second multiplying device to the symbols of the digital input signal to generate a digital output having symbols; and
 the register device receiving the symbols ofthe digital output signal of the adding device.

* * * * *